United States Patent [19]

Franceschini

[11] Patent Number: 4,963,881
[45] Date of Patent: Oct. 16, 1990

[54] METHOD AND APPARATUS FOR ENHANCING THE SIGNAL RESOLUTION OF AN ANALOG-TO-DIGITAL CONVERTER

[75] Inventor: Michael R. Franceschini, Centerport, N.Y.

[73] Assignee: Hazeltine Corporation, Greenlawn, N.Y.

[21] Appl. No.: 425,146

[22] Filed: Oct. 23, 1989

[51] Int. Cl.⁵ ............................................. H03M 1/20
[52] U.S. Cl. .................................. 341/131; 341/155; 341/118
[58] Field of Search ................ 341/131, 155, 126, 118

[56] References Cited

U.S. PATENT DOCUMENTS 3,882,488  5/1975  Kosakowski et al. .............. 341/131
4,751,496  6/1988  Araki et al. .......................... 341/131

Primary Examiner—William M. Shoop, Jr.
Assistant Examiner—Sharon D. Logan
Attorney, Agent, or Firm—Edward A. Onders

[57] ABSTRACT

A method and apparatus for enhancing the resolution of an analog-to-digital converter. The method uses the addition of a second analog waveform to a first analog signal which is to be converted. When the composite signal is converted to digital form, this enhances the effective resolution of the A/D converter with respect to the first signal. Integration of the composite digital signal causes the effects of the second waveform to average to zero. The result is an enhanced resolution signal without undesired effects of the added second signal.

8 Claims, 1 Drawing Sheet

METHOD AND APPARATUS FOR ENHANCING THE SIGNAL RESOLUTION OF AN ANALOG-TO-DIGITAL CONVERTER

This invention was made with government support under Contract F30602-83-C-0107 awarded by the Department of the Air Force. The government has certain rights in this invention.

BACKGROUND OF THE INVENTION

The invention relates generally to analog-to-digital (A/D) converters having a limited number of quantization levels.

Digital quantization of analog signals may be accomplished using standard A/D conversion techniques. However, in some instances an existing A/D converter having a fixed number of quantization levels can not provide adequate resolution when used with certain input signals.

It is, therefore, an object of the present invention to provide a method for enhancing the signal resolution of an A/D converter without undesirably affecting the resulting digital signal.

SUMMARY OF THE INVENTION

According to the invention, a second waveform is added to a first analog signal, forming a composite signal. The second analog waveform has a peak-to-peak amplitude comparable to the maximum peak-to-peak amplitude of the first analog signal, has zero average value, and has a larger period than the first signal. The composite analog signal is converted to digital form using an A/D converter having a limited number of quantization levels. The output signal is then integrated to reduce undesired effects of the added second signal.

For a better understanding of the present invention, and its benefits, reference is made to the following description taken in conjunction with the accompanying drawing, and its scope specified in the claims.

DETAILED DESCRIPTION OF THE INVENTION

Figure 1:
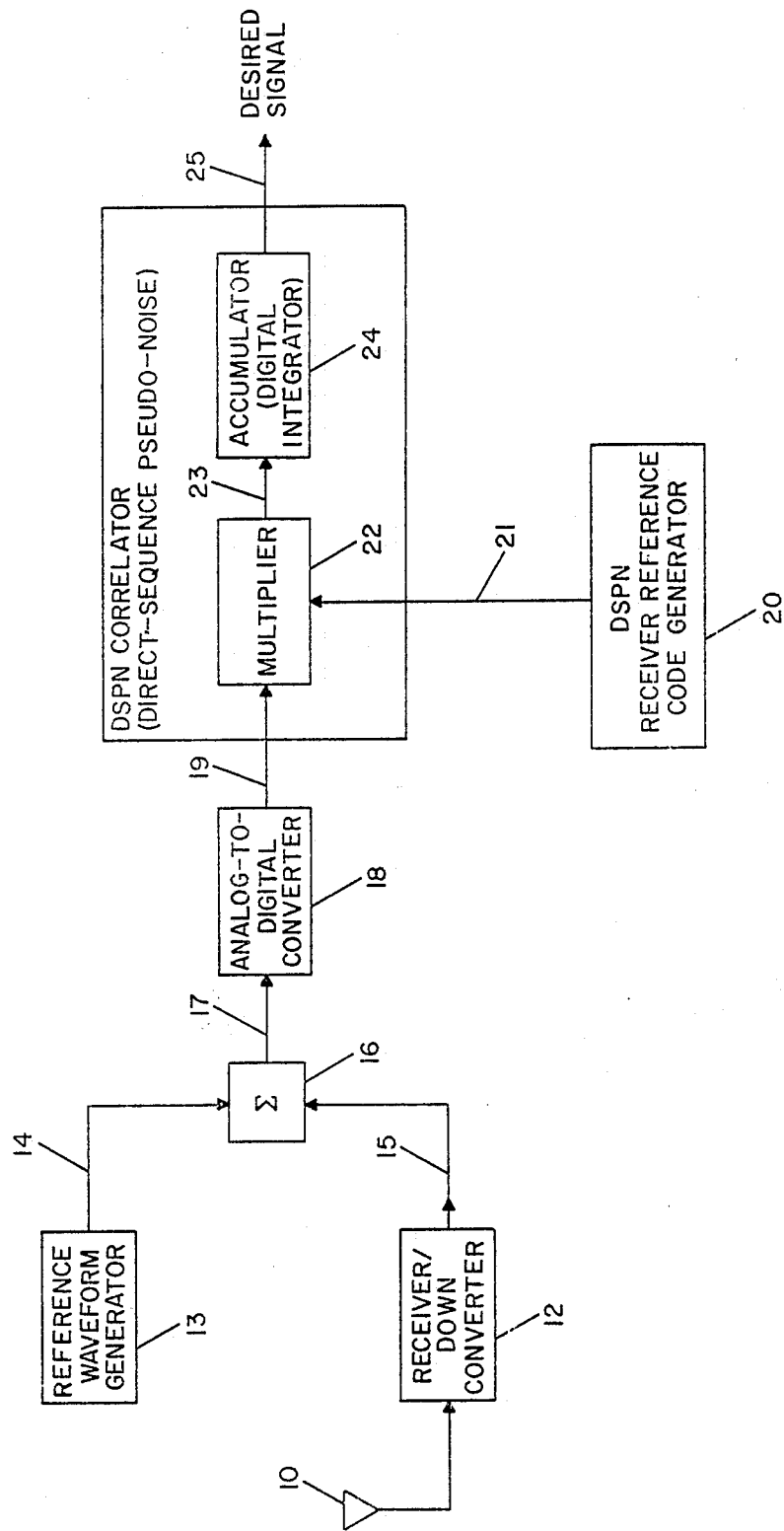
FIG. 1 is a spread spectrum receiver embodying the present invention.

In the spread spectrum receiver of FIG. 1, Antenna 10 receives a spread spectrum transmission which is down converted in Receiver/Down-Converter 12.

Resulting signal 15 is a random-like waveform whose peak-to-peak amplitude variation would use few of the available quantization levels of A/D converter 18 if applied directly thereto. For example, a typical signal may only use 4 out of 256 quantization levels of an 8 bit A/D converter. The reason for this is that it is necessary to provide sufficient dynamic range overhead for interfering signals which may arrive at antenna 10. The resulting digital signal, therefore, would suffer from a loss of resolution. This problem is remedied by employing the invention's methodology.

According to the invention, a second analog waveform 14, supplied by Reference Waveform Generator 13, is added to signal 15 by Adder 16. Analog waveform 14 has a peak-to-peak amplitude comparable to the maximum peak-to-peak amplitude of signal 15. Waveform 14 must also have zero average valve, and a larger period than signal 15.

As used herein, comparable amplitude means that waveform 14 has an amplitude equal to or greater than the maximum peak-to-peak amplitude variation of signal 15. As an illustration, using the previous example given above for signal 15, waveform 14 would have a peak-to-peak amplitude equal to or greater than 4 quantization levels of an 8 bit A/D converter. Such a waveform, for example, may be a triangular wave having a period which is 16 times greater than the period of signal 15, and having zero average valve.

Resulting composite signal 17 is converted to digital form by A/D converter 18, which may be any conventional high speed unit.

The resulting digital composite signal 19 is multiplied with reference signal 21 in Multiplier 22. Signal 21 is a de-spreading function signal corresponding to the spread spectrum transmission received at antenna 10 and has zero average valve. Signal 21 is provided by direct sequence pseudo-noise (DSPN) Receiver Reference Code Generator 20.

Digital Integrator 24 integrates the resulting signal 23 over the length of an information symbol (bit) that is significantly longer than the period of waveform 14, thereby causing the effects of both waveform 14 and signal 21 to average to zero. Therefore, output signal 25 is the desired digital signal with increased resolution and without undesired effects from signal 14 having been added to signal 15. Using this process, the effective resolution of an 8 bit A/D converter may be increased to 11 bits.

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A method for enhancing the signal resolution capabilities of an analog-to-digital converter with respect to a first analog signal to be converted, comprising the steps of:
    forming a composite signal by adding a predetermined second analog waveform to said first analog signal, where said second analog waveform has a peak-to-peak amplitude comparable to the maximum peak-to-peak amplitude of said first analog signal, zero average valve, and a larger period than said first analog signal;
    converting said composite signal to digital form using an A/D conversion process that inherently has a limited number of quantization levels;
    integrating said digital composite signal, thereby reducing the undesired effects of said second analog waveform.

2. The method of claim 1, where said first analog signal is a spread spectrum signal, and said method multiplies said digital composite signal with a reference code having zero average valve.

3. The method of claim 2, where said A/D converstion process has 256 quantization levels and said first analog signal has a peak-to-peak amplitude variation using only a minor fraction of said quantization levels.

4. The method of claim 3, where said second analog waveform is a triangular wave.

5. Apparatus for enhancing the signal resolution capabilities of an analog-to-digital converter with respect to a supplied first analog signal to be converted, comprising:

means for supplying said first analog signal;

means for forming a composite signal by adding a second analog waveform to said first analog signal, where said second analog waveform has a peak-to-peak amplitude comparable to the maximum peak-to-peak amplitude of said first analog signal, zero average valve, and a larger period than said first analog waveform;

means for converting said composite signal to digital form using an A/D conversion process that inherently has a limited number of quantization levels;

means for integrating said digital composite signal, thereby reducing the undesired effects of said second analog waveform.

6. The apparatus of claim 5, where said first analog signal is a spread spectrum signal, and said apparatus includes means for multiplying said digital composite signal with a reference code having zero average valve.

7. The apparatus of claim 6, where said A/D conversion process has 256 quantization levels and said first analog signal has a peak-to-peak amplitude variation using only a minor fraction of said quantization levels.

8. The apparatus of claim 7, where said second analog waveform is a triangular wave.

* * * * *